United States Patent
Wands et al.

(10) Patent No.: US 9,769,952 B2
(45) Date of Patent: Sep. 19, 2017

(54) DATA CENTER COOLING DEVICE

(71) Applicant: Wells Fargo Bank, N.A., San Francisco, CA (US)

(72) Inventors: Charlie Wands, Denver, NC (US); John McKenna, Concord, NC (US)

(73) Assignee: Wells Fargo Bank, N.A., San Francisco, CA (US)

( * ) Notice: Subject to any disclaimer, the term of this patent is extended or adjusted under 35 U.S.C. 154(b) by 756 days.

(21) Appl. No.: 14/175,595

(22) Filed: Feb. 7, 2014

(65) Prior Publication Data

US 2015/0230364 A1    Aug. 13, 2015

(51) Int. Cl.
H05K 7/20    (2006.01)

(52) U.S. Cl.
CPC ..... H05K 7/20145 (2013.01); H05K 7/20736 (2013.01); H05K 7/20745 (2013.01)

(58) Field of Classification Search
CPC ........... H05K 7/20145; H05K 7/20736; H05K 7/20745
USPC ........................................ 454/184
See application file for complete search history.

(56) References Cited

U.S. PATENT DOCUMENTS

| | | | |
|---|---|---|---|
| 4,535,386 A * | 8/1985 | Frey, Jr. ................ | H05K 7/206 165/104.33 |
| 6,105,875 A * | 8/2000 | LaGrotta ................ | H02B 1/565 165/80.3 |
| 7,869,210 B2 * | 1/2011 | Moss ................ | H05K 7/20836 361/694 |
| 2012/0083196 A1* | 4/2012 | Mockridge .......... | F24F 11/0001 454/184 |
| 2012/0142265 A1* | 6/2012 | Wei ..................... | H05K 7/20745 454/184 |
| 2012/0298330 A1* | 11/2012 | Mysse, III ............. | H05K 7/206 165/96 |
| 2014/0073235 A1* | 3/2014 | Wang ..................... | B01D 46/28 454/184 |

FOREIGN PATENT DOCUMENTS

WO    2009/103090 A2    8/2009

OTHER PUBLICATIONS

Hannaford, Peter, "Ten Cooling Solutions to Support High-Density Server Deployment," White Paper #42. APC by Schneider Electric, 2006-2008 American Power Conversion, www.apc.com, 16 pages.
Seaton, Ian, CPI Passive Cooling® Solutions: A Path to Higher Density and Lower Cost, Chatsworth Products, Inc., 2009, www.chatsworth.com, 13 pages.

* cited by examiner

*Primary Examiner* — Gregory Huson
*Assistant Examiner* — Dana Tighe
(74) *Attorney, Agent, or Firm* — Merchant & Gould P.C.

(57) ABSTRACT

An apparatus for routing air passing through a vent of an enclosure with electrical equipment includes a routing portion, a channeling portion, and a distal portion. The routing portion deflects the air passing through the vent of the enclosure. The channeling portion forms a passage of the air between the routing portion and the distal portion. The distal portion allows the air to flow from the channeling portion to surrounding or from the surrounding to the channeling portion.

12 Claims, 8 Drawing Sheets

DATA CENTER COOLING DEVICE

BACKGROUND

Heat dissipated by electronic equipment can be critical to operation of the equipment because it can have adverse effects on the performance and reliability of the equipment. One environment where heat control is critical is a data center containing racks or cabinets of electronic equipment, such as servers, CPUs, storage, networking and communication systems.

To address the heat generated by electronic equipment in data centers, air cooling devices are used to provide a flow of cold air to the electronic equipment. Such cooling devices are typically referred to as computer room air conditioning (CRAC) units. The CRAC units provide cooler air into the data center, and the racks of electronic equipment are cooled as the cooler air is drawn into the racks and over the equipment therein. The air passing over the equipment is heated by the operating equipment and exhausted out of the racks, and returns to the CRAC units.

SUMMARY

In general terms, this disclosure is directed to an air conditioning system for a data center. In one possible configuration and by non-limiting example, the air conditioning system includes a routing apparatus. Various aspects are described in this disclosure, which include, but are not limited to, the following aspects.

One aspect is an apparatus for routing air passing through a vent of an enclosure with electrical equipment, the air flowing in a first direction at the vent of the enclosure, the apparatus comprising: a routing portion engaged with the enclosure and being in fluid communication with the vent of the enclosure, the routing portion being configured to deflect the air passing through the vent of the enclosure in a second direction, the second direction being different from the first direction; a channeling portion being in fluid communication with the routing portion and forming a passage of the air in the second direction; and a distal portion being in fluid communication with the channeling portion and open to surroundings, the distal portion configured to allow the air to flow from the channeling portion to the surroundings or from the surrounding to the channeling portion.

Another aspect is an air conditioning system for data center hardware, the system comprising: an enclosure with electrical equipment, the enclosure having a first vent and a second vent at a first side thereof, wherein the first vent is configured to allow air at a first temperature to flow in a first direction between the enclosure and a surrounding therethrough, and the second vent is configured to allow the air at a second temperature to flow in a second direction between the enclosure and the surrounding therethrough, the second temperature being different from the first temperature and the second direction opposite to the first direction, and a routing device configured to route the air at the first temperature between the first vent and surroundings, the routing device comprising: a routing portion engaged with the enclosure and being in fluid communication with the first vent of the enclosure, the routing portion configured to deflect the air at the first temperature passing through the first vent in a third direction, the third direction different from the first direction; a channeling portion being in fluid communication with the routing portion and forming a passage for the air at the first temperature in the third direction; and a distal portion being in fluid communication with the channeling portion and open to the surroundings, the distal portion configured to allow the air at the first temperature to flow between the channeling portion and the surroundings, the surroundings adjacent a second side of the enclosure, the second side being different from the first side of enclosure.

A yet another aspect is a method of air conditioning for an enclosure with electrical equipment, the method comprising: supplying air at a first temperature to a first side of the enclosure, wherein the enclosure includes a first vent and a second vent, the first and second vents arranged on the first side; receiving, by the enclosure, the air at the first temperature through the first vent of the enclosure; discharging, by the enclosure, air at a second temperature through the second vent of the enclosure, the second temperature higher than the first temperature; deflecting, by a routing device, the air at the second temperature to flow along a second side of the enclosure toward a third side of the enclosure, wherein the second side is adjacent the first side and the third side is opposite to the first side and adjacent the second side; and discharging, by the routing device, the air at the second temperature to surroundings adjacent the third side of the enclosure.

DETAILED DESCRIPTION

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Figure 1:
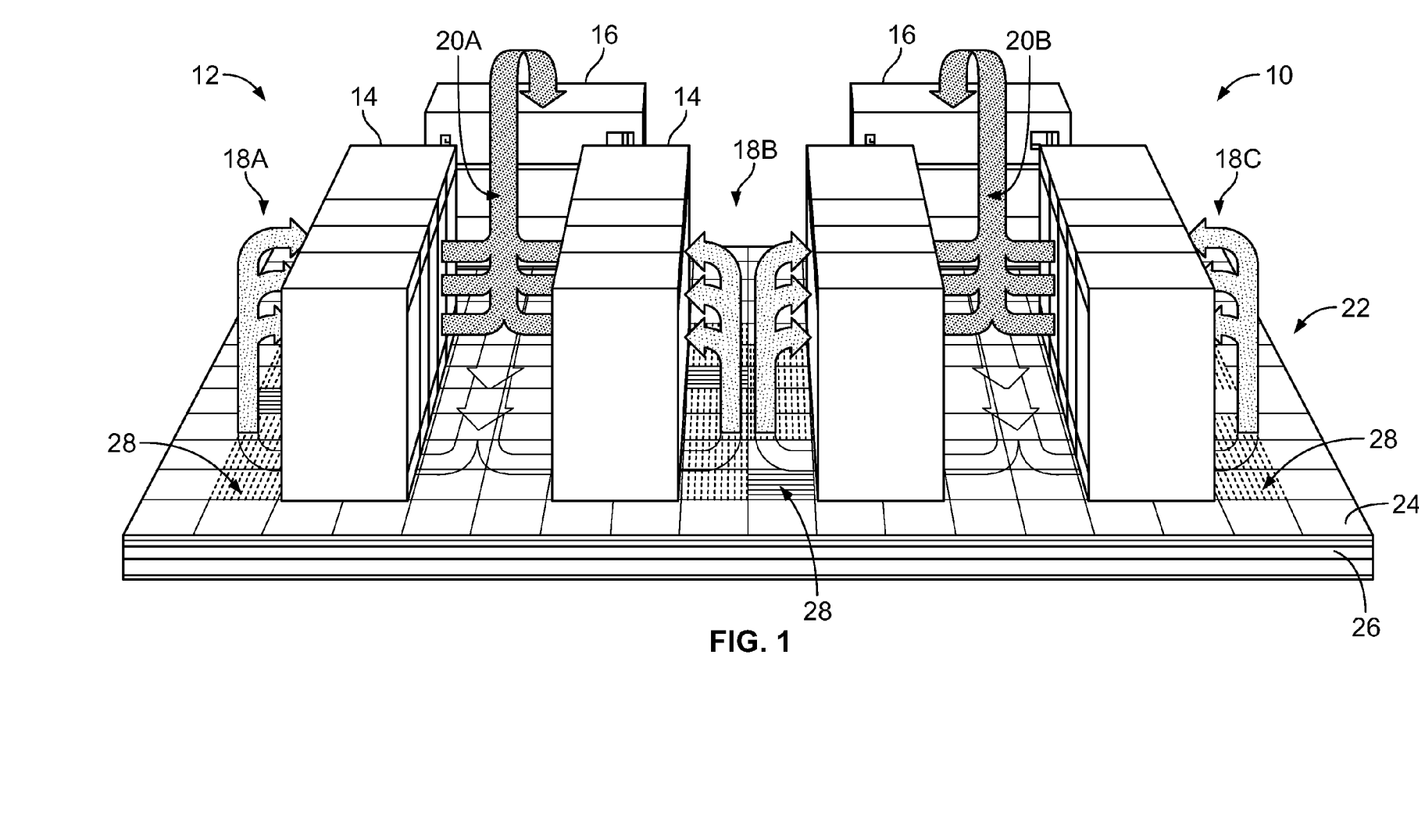
FIG. 1 is a schematic view of an example cooling system for a data center.

FIG. 1 is a schematic view of an example cooling system 10 for a data center 12. The data center 12 includes a plurality of electronic equipment racks (also referred to herein as "cabinet(s)" or "enclosure(s)") 14. The equipment racks 14 contain electronic equipment, such as servers, CPUs, storage, networking and communication systems. In some embodiments, the equipment racks 14 are high-density racks in which several pieces of electronic equipment are clustered together in the racks. In such cases, the equipment racks 14 can be preferably spaced apart across the entire floor area to alleviate the ineffectiveness of cooling. An example of the equipment rack 14 is described in further detail with reference to FIGS. 2 and 3.

The cooling system 10 operates to provide the data center with appropriate cooling to achieve optimum performance of electronic equipment in the data center. The cooling system 10 includes computer room air conditioning (CRAC) units 16, cold aisles 18A, 18B and 18C (collectively, 18), hot aisles 20A and 20B (collectively, 20), and a cold air circulation mechanism 22.

The CRAC units 16 operate to monitor and maintain the temperature, air distribution and humidity in the data center 12. The CRAC units 16 supply cold air into the data center 12. In some embodiments, the CRAC units 16 introduce cold air into the cold aisles 18 so that the cold air is drawn in the equipment racks 14. The air drawn in the racks 14 is heated by the electronic equipment therein and exhausted out of the racks 14. In some embodiments, the heated air is discharged into the hot aisles 20. The CRAC units 16 then intake the heated air collected at the hot aisles 20, for example.

The cold aisles 18 are configured to collect cold air generated by the CRAC units 16 so that the cold air is effectively drawn into the equipment racks 14. In some embodiments, the cold aisles 18 face output ducts of the CRAC units 16.

The hot aisles 20 provide passages for air that has been heated in the equipment racks 14 and exhausted therefrom before the heated air returns to the CRAC units 16. In some embodiments, the hot aisles 20 are rows into which the heated air from the CRAC units pours.

In some embodiments, the cold aisles 18 are isolated from the hot aisles 20 to prevent cold air and hot exhaust air from mixing each other. As illustrated in FIG. 1, the cooling system 10 implements a hot aisle/cold aisle arrangement. In the hot aisle/cold aisle arrangement, the cooling system 10 lines up the electronic equipment racks 14 in alternating rows with the cold aisles 18 and the hot aisles 20. As such, the cold aisles 18 and the hot aisles 20 are separated with the rows of the racks 14 therebetween.

In some embodiments, the cooling system 10 includes the cold air circulation mechanism 22. The cold air circulation mechanism 22 operates to take cold air from the CRAC units 16 and deliver the air to the cold aisles 18 so that the air is effectively drawn in the equipment racks 14. The cold air circulation mechanism 22 includes a raised floor 24, a plenum 26, and vented floor tiles 28.

The raised floor 24 provides space for the equipment racks 14 and the CRAC units 16 to be arranged thereon. The raised floor 24 also defines the cold aisles 18 and the hot aisles 20.

The plenum 26 is defined by the raised floor 24 and operates to provide a path for the cold air to travel from the CRAC units to the vented floor tiles 28. The CRAC units 16 are in fluid communication with the plenum 26 through the raised floor 24 so that the CRAC units 16 provide cold air into the plenum 26. The plenum 26 allows cold air to flow to the cold aisles 18 through the vented floor tiles 28.

The vented floor tiles 28 are formed on the raised floor 24. In some embodiments, the vented floor tiles 28 are arranged along the cold aisles 18 to effectively deliver the cold air to the cold aisles 18 only. Furthermore, the vented floor tiles 28 can be located adjacent the intake vents of the equipment racks 14 so that the cold air from the CRAC units 16 are delivered as closely as possible to the intake vents of the equipment racks 14.

Some electronic equipment racks 14 are designed to draw cold air in at one side and exhaust warm air at another side of the rack. For example, each of the equipment racks 14 may have an intake vent at a front side of the rack 14, which draws cold air therein, and an exhaust vent at a rear side of the rack 14, which discharges heated air out of the rack 14. The equipment racks 14 can be oriented so that the front sides face each other with the cold aisles 18 and the rear sides face each other with the hot aisles 20. In this manner, the cold air from the CRAC units 16 can be separated from the hot air exhausted from the equipment racks 14, thereby preventing the cold air from mixing with the hot air in the data center 12.

In contrast, many electronic equipment racks 14 have the intake vents for drawing cold air in and the exhaust vents for discharging heated air at the same side of the racks. When such equipment racks 14 are arranged for the intake and exhaust vents to face the cold aisles 18, the heated air from the equipment racks 14 is discharged to the cold aisles 18, instead of the hot aisles 20. When the racks 14 are arranged to face the hot aisles 20, the cold air provided from the CRAC units 16 has to pass through the hot aisles 20 before it is drawn into the racks 14. In both cases, cold air and hot exhaust air are mixed up at either the cold aisles 18 or the hot aisles 20. This prevents the effective cooling performance of the cooling system 10 for the data center 12. An example of the electronic equipment rack having the intake vents and the exhaust vents at the same side is illustrated below with reference to FIGS. 2 and 3.

Figure 2:
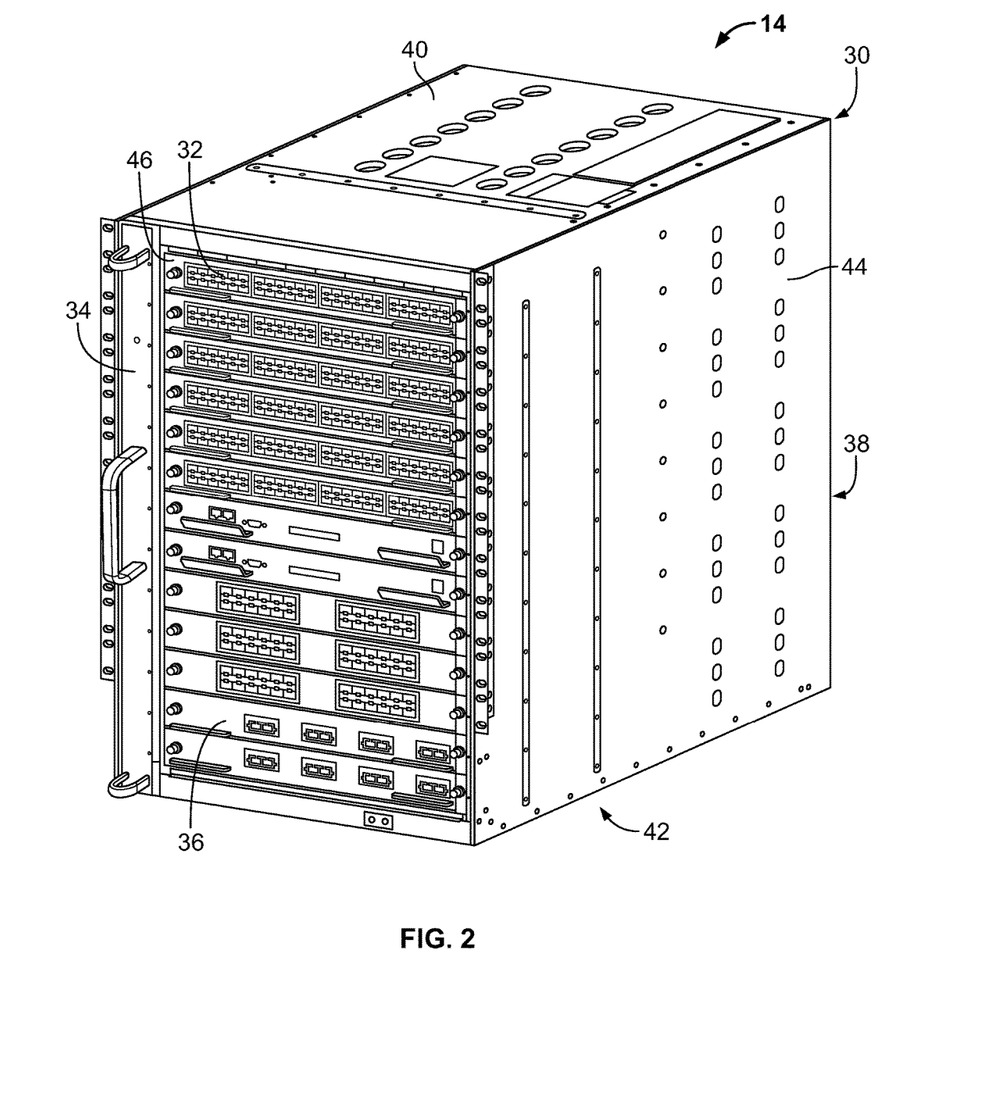
FIG. 2 is a front perspective view of an example electronic equipment rack.

FIG. 2 is a front perspective view of an example electronic equipment rack 14. The electronic equipment rack 14 includes electronic equipment, such as servers, CPUs, storage, networking and communication systems. In the example of FIG. 2, the equipment rack 14 is designed for computer network switches. Examples of such computer network switches include Cisco MDS 9500 series, such as Cisco 9513 MDS Multilayer Director, which is distributed by Cisco Systems, Inc. of Rosemont, Ill. The equipment rack 14 includes a chassis 30, switching modules 32, and a fan tray 34.

The chassis 30 is designed to retain the switching modules 32, the fan tray 34 and other electronic devices. The chassis 30 has a front panel 36, a rear panel 38 (FIG. 3), a top panel 40, a bottom panel 42, and opposing side panels 44. The top panel 40, the bottom panel 42, and the opposing side panels 44 define an enclosure to accommodate the switching modules 32, the fan tray 34 and other electronic devices, such as power supplies. The front panel 36 provides a plurality of slots 46 for the switching modules 32 and the fan tray 34.

The switching modules 32 are configured to provide multiple switches for computer networking. In some embodiments, the switching modules 32 are configured as multilayer switches. The switching modules 32 are mounted into the slots 46 arranged on the front panel 36.

The equipment rack 14 optionally includes the fan tray 34. The fan tray 34 is configured to support at least one individual fan for circulating air within the chassis 30. In this example, the fan tray 34 is vertically mounted into the chassis 30 adjacent one of the opposing side panels 44.

Figure 3:
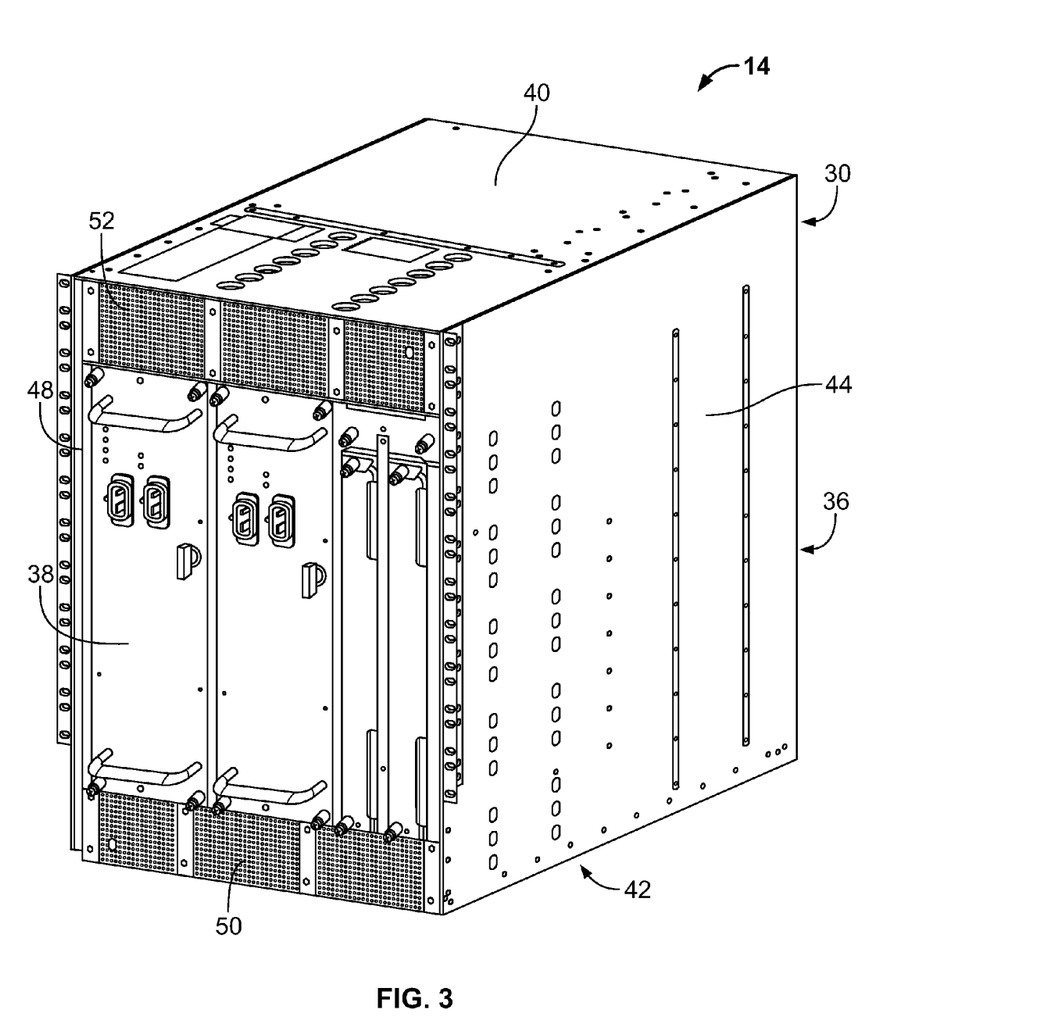
FIG. 3 is a rear perspective view of the electronic equipment rack of FIG. 2.

FIG. 3 is a rear perspective view of the electronic equipment rack 14 of FIG. 2. The rear panel 38 of the chassis 30 includes a plurality of slots 48, an intake vent 50, and an exhaust vent 52.

The slots 48 are configured to accommodate electronic devices within the chassis 30. Such electronic devices include power supplies and functional modules.

The intake vent 50 operates to draw cold air in the chassis 30. The intake vent 50 is configured to receive cold air provided by the CRAC units 16 and delivered by the cooling system 10. In this example, the intake vent 50 is arranged at a lower portion of the rear panel 38.

The exhaust vent 52 operates to exhaust air out of the chassis 30. In this example, the exhaust vent 52 is arranged at an upper portion of the rear panel 38. When the cold air is drawn in the equipment rack 14 through the intake vent 50, the air flows around the electronic equipment within the rack 14. Heat generated by the electronic equipment is transferred to the air, thereby increasing the temperature of the air. The heated air then tends to rise up for lower density than the cold air and reaches the exhaust vent 52 located at the upper portion of the rear panel 38. The heated air is exhausted out of the equipment rack 14 and eventually returns to the CRAC units 16.

The cooling system 10 as described with reference to FIG. 1 may not perform optimally with the equipment racks 14 of FIGS. 2 and 3 because cold air and hot exhaust air can be mixed at a rear side of the rack 14, which is adjacent the rear panel 38 of the rack 14. As explained above, if the equipment racks 14 are arranged for the rear panels 38 to face the cold aisles 18, the heated air from the equipment racks 14 is discharged to the cold aisles 18 and increases the temperature of the cold aisles 18, thereby impairing the cooling effect of the cold air supplied by the CRAC units 16. Similarly, if the rear panels 38 is arranged to face the hot aisles 20, cold air meets hot exhaust air at the hot aisles 20 before being drawn into the intake vent 50 of the equipment rack 14. Therefore, the cooling system 10 will provide better performance with a routing apparatus for either conveying cold air from the cold aisles 18 to the intake vent 50 or delivering hot exhaust air from the exhaust vent 52 to the hot aisles 20. An example of a routing apparatus adapted for the equipment rack 14 or the chassis 30 of FIGS. 2 and 3 is illustrated with reference to FIGS. 4-9.

Figure 4:
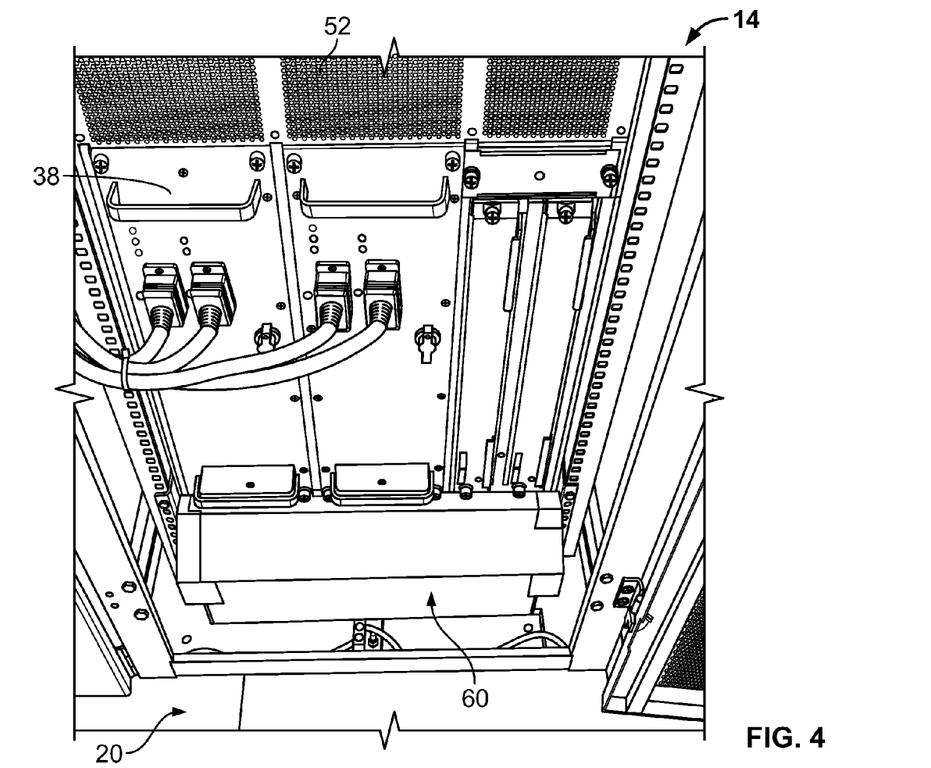
FIG. 4 is a perspective view of an example routing apparatus installed to the equipment rack of FIGS. 2 and 3.

FIG. 4 is a perspective view of an example routing apparatus 60 installed to the equipment rack 14 of FIGS. 2 and 3. In this example, the rear panel 38 of the chassis 30 is arranged to face the hot aisle 20. Thus, both of the intake vent 50 and the exhaust vent 52 open toward the hot aisle 20. As shown in FIG. 4, the intake vent 50 is covered by the routing apparatus 60, which defines a passage between the intake vent 50 and the cold aisle 18, at which the front panel 36 of the chassis 30 is arranged. The routing apparatus 60 operates to block the intake vent 50 from the hot aisle 20 and prevent hot air discharged from the exhaust vent 52 from mixing with cold air supplied by the CRAC units 16. Furthermore, the routing apparatus 60 forms a conduit or passage from the cold aisle 18 to the intake vent 50 so that cold air supplied by the CRAC units 16 is effectively drawn into the intake vent 50 while being isolated from the hot exhaust air at the hot aisle 20.

Figure 5:
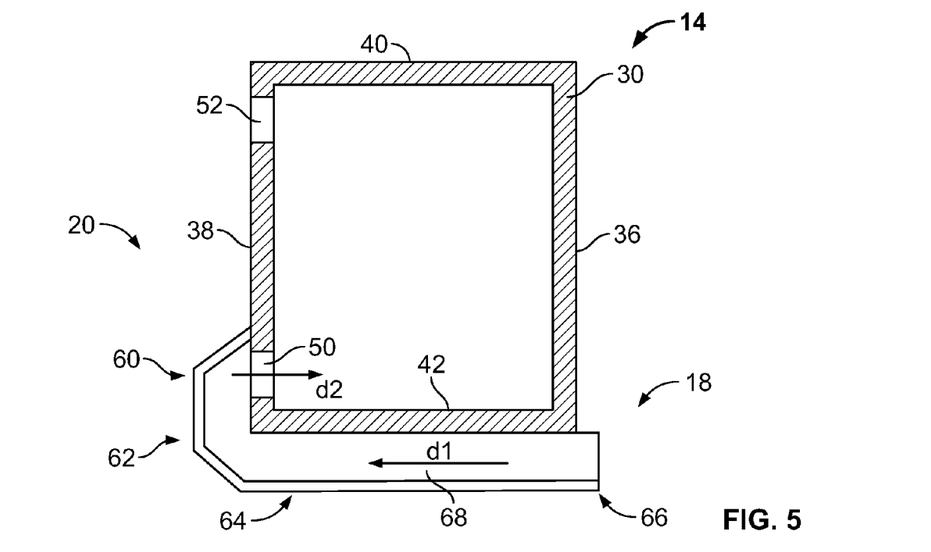
FIG. 5 is a schematic, side cross-sectional view of the routing apparatus installed to the equipment rack of FIG. 4.

FIG. 5 is a schematic, side cross-sectional view of the routing apparatus 60 installed to the equipment rack 14 of FIG. 4. The routing apparatus 60 is installed to the equipment rack 14 to form an isolated conduit from the cold aisle 18 to the intake vent 50 of the chassis 30. In some embodiments, the routing apparatus 60 includes a routing portion 62, a channeling portion 64, and a distal portion 66.

The routing portion 62 operates to deflect airflow between the intake vent 50 and the channeling portion 64. The routing portion 62 is designed to engage a lower portion of the rear panel 38 and cover the intake vent 50. By covering the intake vent 50, cold air drawn into the intake vent 50 can be isolated from hot air exhausted from the exhaust vent 52 at the same side of the equipment rack 14. Further, the routing portion 62 is in fluid communication with the channeling portion 64.

The channeling portion 64 operates to provide a passage 68 for air between the routing portion 62 and the distal portion 66. In this example, the channeling portion 64 is arranged to engage the bottom panel 42 of the chassis 30 and forms the passage 68 for cold air from the distal portion 66 to the routing portion 62 along the channeling portion 64. The cold air is conveyed along the channeling portion 64 in a direction (d1) generally parallel with the bottom panel 42 of the chassis 30.

The distal portion 66 operates to allow air to flow from surrounding to the channeling portion 64, or vice versa. The distal portion 66 is in fluid communication with the channeling portion 64. In this example, the distal portion 66 opens to surrounding at the cold aisle 18. Thus, the distal portion 66 draws cold air from the cold aisle 18 and delivers it to the channeling portion 64.

In this example, as the rear panel 38 of the chassis 30 faces the hot aisle 20 and the front panel 36 faces the cold aisle 18, the routing apparatus 60 operates to draw cold air from the cold aisle 18 into the intake vent 50 of the chassis 30. As illustrated in FIG. 5, the distal portion 66 is arranged adjacent the front panel 36 of the chassis 30 and opens to surrounding at the cold aisle 18. Thus, the distal portion 66 draws cold air from the cold aisle 18 and allows the cold air to flow into the channeling portion 64. Then, the cold air flows along the passage 68 defined by the channeling portion 64. The direction (d1) of the cold air flowing along the passage 68 is generally parallel with the bottom panel 42 of the chassis 30.

When the cold air reaches the routing portion 62, the cold air is deflected by the routing portion 62 to the intake vent 50. In particular, the routing portion 62 changes the direction of the cold air and guide the cold air into the intake vent 50 of the chassis 30. Thus, the direction (d1) of the cold air flowing along the channeling portion 64 is substantially opposite to a direction (d2) of the cold air passing through the intake vent 50.

Although it has been described or illustrated that the routing apparatus 60 is installed to the equipment rack 14 to cover the intake vent 50, the routing apparatus 60 can also be installed to the equipment rack 14 to cover the exhaust vent 52 if the rear panel 38 of the chassis 30 is arranged to face the cold aisle 18. In this case, the routing apparatus 60 operates to convey hot air exhausted from the exhaust vent 52 to the hot aisle 20 and isolate the hot exhaust air from cold air at the cold aisle 18. In particular, the routing portion 62 will engage an upper portion of the rear panel 38 to cover the exhaust vent 52. The channeling portion 64 engages the top panel 40 of the chassis 30 and forms a passage for hot exhaust air from the routing portion 62 to the distal portion 66 along the channeling portion 64. The distal portion 66 is arranged to open to surrounding at the hot aisle 20. Thus, the distal portion 66 discharges hot exhaust air conveyed from the exhaust vent 52 to the surrounding at the hot aisle 20.

FIGS. 6-9 illustrate an example routing apparatus 60 adapted for the adapted for the equipment rack 14 of FIGS. 2 and 3. In this example, the routing apparatus 60 is primarily described hereinafter as being associated with the intake vent 50 of the chassis 30 to route cold air from the cold aisle 18 to the intake vent 50. As discussed above, however, the routing apparatus 60 can also be installed to the exhaust vent 52 of the chassis 30 for conveying hot exhaust air to the hot aisle 20. As the same principles and features apply to both of the configurations, the description of the routing apparatus 60 coupled to the exhaust vent 52 is omitted for brevity purposes.

Figure 6:
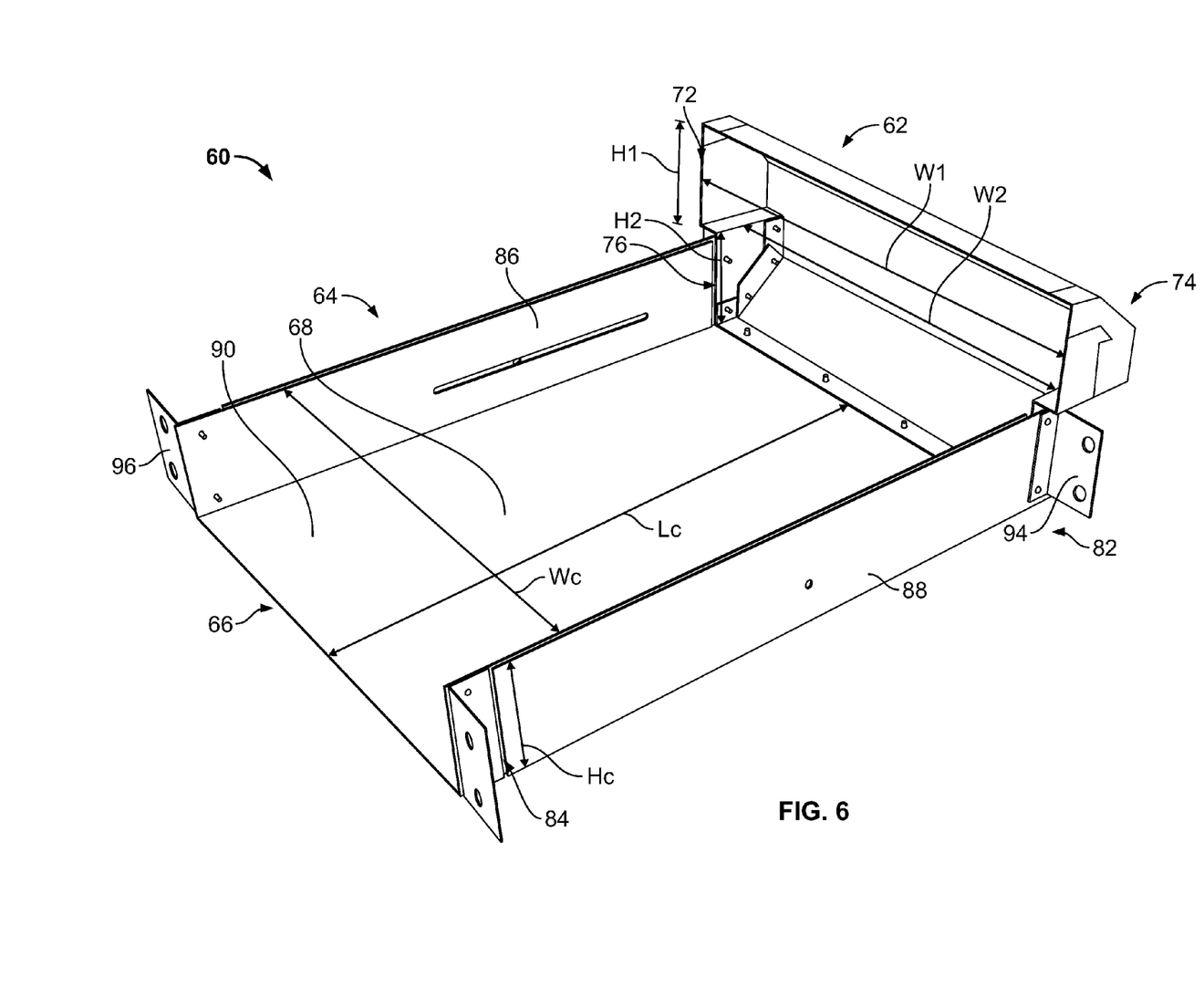
FIG. 6 is a perspective view of an example routing apparatus.

FIG. 6 is a perspective view of an example routing apparatus 60. As discussed above with reference to FIG. 5, the routing apparatus 60 includes the routing portion 62, the channeling portion 64, and the distal portion 66.

The routing portion 62 includes a coupling portion 72, a deflecting portion 74, a channel-matching portion 76, and proximal installation flanges 94.

The coupling portion 72 is engaged with the rear panel 38 of the chassis 30 to cover the intake vent 50 or the exhaust vent 52. In the examples of FIGS. 4 and 5, the coupling portion 72 is arranged to cover the intake vent 50 of the chassis 30. In some embodiments, the coupling portion 72 is dimensioned to cover a portion of the rear panel 38 of the chassis 30 that includes the intake vent 50. In other embodiments, the coupling portion 72 is dimensioned to cover the entire width of the rear panel 38 while covering the intake vent 50. For example, the coupling portion 72 has a width (W1) and a height (H1). The width (W1) of the coupling portion 72 is substantially sized the same as width of the rear panel 38 of the chassis 30 so that the coupling portion 72 covers the entire width of the rear panel 38 that includes the intake vent 50. Alternatively, the width (W1) of the coupling portion 72 is sized to meet a width of the intake vent 50. The height (H1) of the coupling portion 72 is determined to cover the entire height of the intake vent 50.

The deflecting portion 74 is configured to effectively change the direction of air flowing from the channeling portion 64 toward the intake vent 50. The deflecting portion 74 is described in further detail with reference to FIGS. 7 and 8.

The channel-matching portion 76 is configured to couple the routing portion 62 to the channeling portion 64 and maintain a fluid communication between the routing portion 62 and the channeling portion 64. In some embodiments, the channel-matching portion 76 has a width (W2) and a height (H2), which are substantially the same as a width (Wc) and a height (Hc) of the channeling portion 64, respectively.

The proximal installation flanges 94 are configured to couple the routing portion 62 to the equipment rack 14 and/or the chassis 30. In some embodiments, the flanges 94 are arranged adjacent the channel-matching portion 76 and extend outwardly from the opposing sides of the channel-matching portion 76. The flanges 94 of the routing portion 62 are attached to a predetermined location of the equipment rack 14 and/or the chassis 30, which can provide adequate support for the routing portion 62. For example, the flanges 94 can be attached to the rear panel 38 of the chassis 30 or the side panels 44 of the chassis 30. In some embodiments, the flanges 94 are attached to the equipment rack 14 and/or the chassis 30 with fasteners of any type. In other embodiments, the flanges 94 are soldered to the equipment rack 14 and/or the chassis 30 for support of the routing portion 62.

The routing apparatus 60 also includes the channeling portion 64. The channeling portion 64 has a first end 82 and a second end 84, and provides the passage 68 between the first and second ends 82 and 84. The channeling portion 64 is coupled to the channel-matching portion 76 of the routing portion 62 at the first end 82. The channeling portion 64 is in fluid communication with the distal portion 66 at the second end 84.

The channeling portion 64 has opposing side panels 86 and 88 and a cross panel 90. The cross panel 90 extends between the opposing side panels 86 and 88. In some embodiments, the opposing side panels 86 and 88 are substantially perpendicular to the cross panel 90. The opposing side panels 86 an 88 and the cross panel 90 extends between the first end 82 and the second end 84. In this example, the opposing side panels 86 and 88 are arranged to be engaged with the bottom panel 42 of the chassis 30 while the cross panel 90 is substantially parallel to the bottom panel 42. As such, the opposing side panels 86 and 88, the cross panel 90, and the bottom panel 42 of the chassis 30 cooperate to form the enclosed passage 68 with four-sided boundary. In other embodiments, the channeling portion 64 has an opposing cross panel adjacent the opposing side panels 86 and 88 and parallel to the cross panel 90 to form the enclosed passage 68 without the bottom panel 42 of the chassis 30.

The channeling portion 64 has the width (Wc) (that is, the width of), the height (Hc) and a length (Lc). The width (Wc) of the channeling portion 64 is defined by the width of the cross panel 90. The height (Hc) of the channeling portion 64 is defined by the height of the side panel 86 or 88. In some embodiments, the height (Hc) is substantially the same as the height (H2) of the channel-matching portion 76. The width (Wc) is substantially the same as the width (W2) of the channel-matching portion 76. In some embodiments, the width (Wc) is configured to be shorter than a width of the bottom panel 42 of the chassis 30 so that the channeling portion 64 and the bottom panel 42 cooperate to form the passage 68. In other embodiments, the width (Wc) is substantially the same as the width of the bottom panel 42 of the chassis 30. For example, the width (Wc) can be about 19 inches and the height (Hc) can be about 3.5 inches.

The length (Lc) of the channeling portion 64 is defined by the length of the side panel 86 or 88 and/or the cross panel 90 from the first end 82 to the second end 84. In some embodiments, the length (Lc) is dimensioned to allow the distal portion 66 to be arranged adjacent the cold aisle 18 so that cold air is effectively drawn to the channeling portion 64 through the distal portion 66. For example, the length (Lc) is sized to be substantially the same as a length or depth of the bottom panel 42 of the chassis 30, which is a distance between the front panel 36 and the rear panel 38 along the bottom panel 42. Furthermore, the length (Lc) is adjustable as necessary, which is described in further detail with reference to FIG. 9.

The routing apparatus 60 further includes the distal portion 66. The distal portion 66 is exposed to surrounding at the cold aisle 18 to draw cold air from the cold aisle 18 into the passage 68 of the channeling portion 64. The distal portion 66 is arranged at the second end 84 of the channeling portion 64 and in fluid communication with the channeling portion 64. In this example, the distal portion 66 is integrally made with the channeling portion 64. In other embodiments, the distal portion 66 is a separate component that is coupled to the second end 84 of the channeling portion 64.

In some embodiments, the distal portion 66 includes distal installation flanges 96 for coupling the distal portion 66 to the equipment rack 14 and/or the chassis 30. In some embodiments, the distal installation flanges 96 are arranged adjacent the second end 84 of the channeling portion 64 and extend outwardly from the opposing sides of the distal portion 66. Similarly to the proximal installation flanges 94, the distal installation flanges 96 are attached to a predetermined location of the equipment rack 14 and/or the chassis 30, which can provide adequate support for the distal portion 66. For example, the flanges 96 can be attached to the front panel 36 of the chassis 30 or the side panels 44 of the chassis 30. In some embodiments, the flanges 96 are attached to the equipment rack 14 and/or the chassis 30 with fasteners of any type. In other embodiments, the flanges 96 are soldered to the equipment rack 14 and/or the chassis 30 for support of the distal portion 66. As such, the distal installation flanges 96 and the proximal installation flanges 94 cooperate to couple the routing apparatus 60 to the equipment rack 14 and/or the chassis 30 so that the equipment rack 14 and/or the chassis 30 support the routing apparatus 60.

In this example, the dimension of the distal portion 66 is substantially the same as the dimension of the channeling portion 64. However, the distal portion 66 can have a different size (for example, width and/or height) from the channeling portion 64. In other embodiments, the distal portion 66 can have one or more curved or deflected portions that guide the opening of the distal portion 66 in a predetermined direction.

In some embodiments, the routing apparatus 60 is made from aluminum for convenient fabrication and easy fit on the equipment rack 14. In other embodiments, the routing apparatus 60 is made from a material with high insulating capability in order to effectively isolate cold air from hot air, or vice versa.

Figure 7:
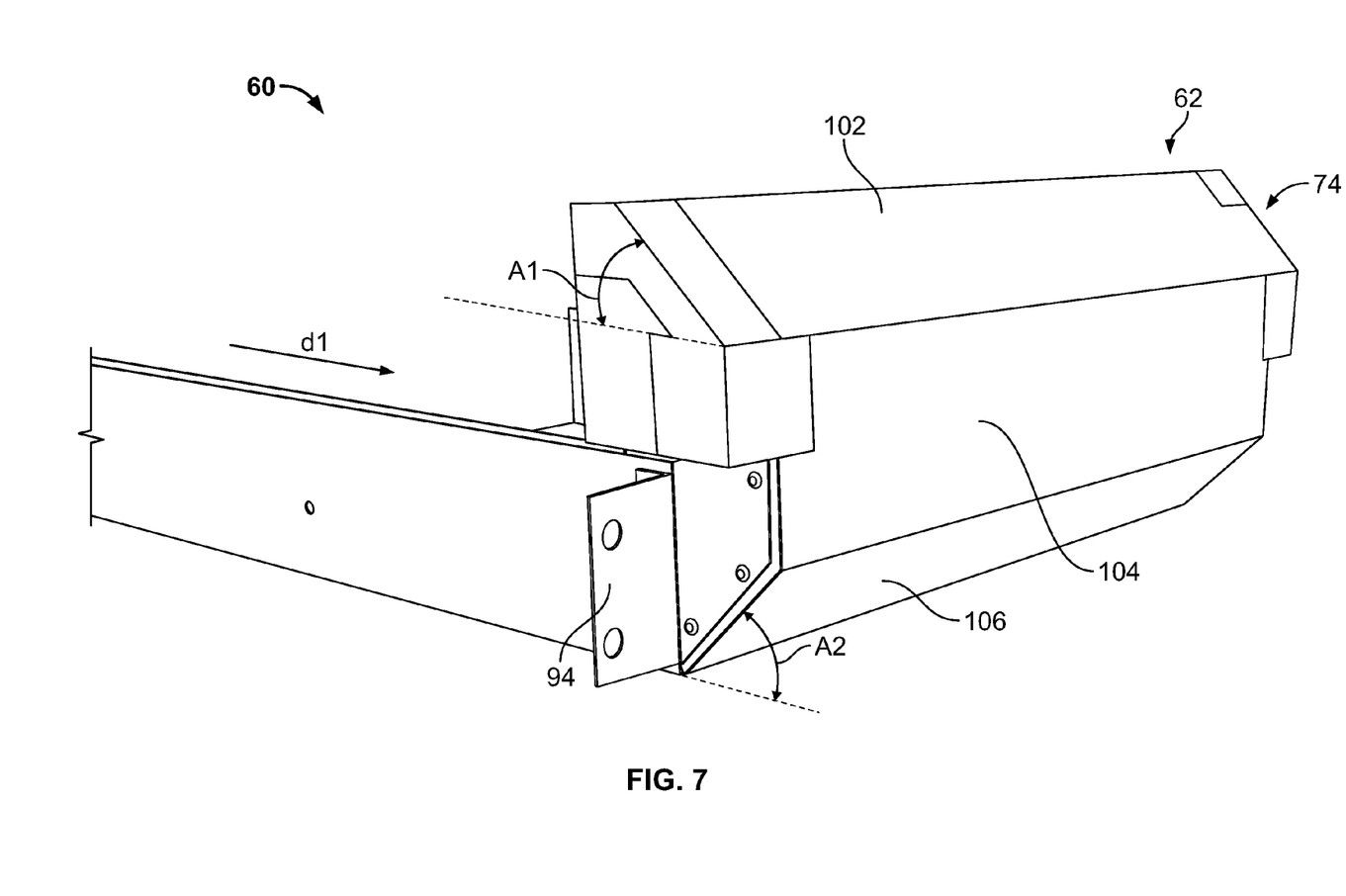
FIG. 7 is a perspective view of an example deflecting portion of the routing apparatus of FIG. 6.
Figure 8:
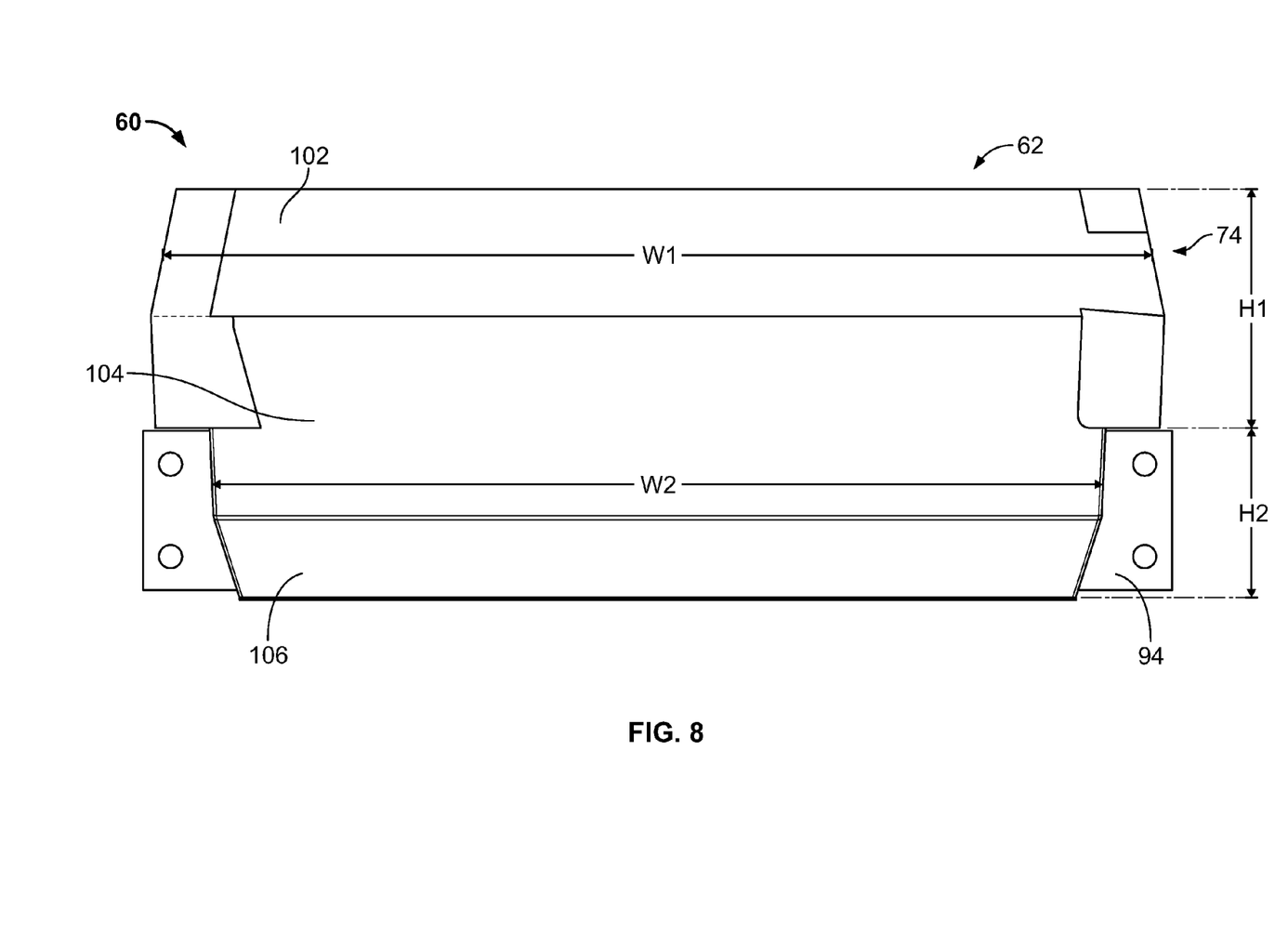
FIG. 8 is a front view of the deflecting portion of FIG. 7.

FIGS. 7 and 8 illustrate the deflecting portion 74 of the routing portion 62 of FIG. 6. FIG. 7 is a perspective view of an example deflecting portion 74. FIG. 8 is a front view of the deflecting portion 74 of FIG. 7. The deflecting portion 74 of the routing portion 62 operates to deflect airflow from the channeling portion 64 to the intake vent 50. In this example, as air flowing along the channeling portion 64 has the direction (d1) substantially opposite to the direction (d2) of air passing through the intake vent 50, the deflecting portion 74 is configured to change the direction of cold air substantially 180 degree from the channeling portion 64 to the intake vent 50. In some embodiments, the deflecting portion 74 includes a first bent portion 102, an intermediate portion 104, and a second bent portion 106.

The first bent portion 102 is connected to the coupling portion 72 and in fluid communication with the intake vent 50. The first bent portion 102 is also connected to the intermediate portion 104 so that the intake vent 50 is in fluid communication with the intermediate portion 104. In this example, the first bent portion 102 has the same width (W1) as the coupling portion 72. The first bent portion 102 is configured to form an angled portion between the coupling portion 72 and the intermediate portion 104 so that cold air flows along the angled portion from the intermediate portion 104 to the intake vent 50. In some embodiments, an angle (A1) of the first bent portion 102 is about 45 degree with respect to a surface parallel to the direction (d1) or the passage 68 of the channeling portion 64. In other embodiments, the angle (A1) of the first bent portion 102 can range between 20 and 80 degrees, depending on several factors, including, but not limited to, a relative geometry of associated portions such as the dimensions of the first bent portion 102, the intermediate portion 104 and the second bent portion 106. In other embodiments, the first bent portion 102 is configured to have a curved portion having a predetermined curvature, which connects the coupling portion 72 and the intermediate portion 104.

The intermediate portion 104 connects the first bent portion 102 and the second bent portion 106 and allows airflow to transition between the first bent portion 102 and the second bent portion 106. In some embodiments, the intermediate portion 104 is substantially perpendicular to the direction (d1) or the passage 68 of the channeling portion 64. In this example, the intermediate portion 104 has the same width (W1) as the first bent portion 102 at the upper part thereof and the same width (W2) as the second bent portion 106 in order to match the difference in width between the first bent portion 102 and the second bent portion 106.

The second bent portion 106 is connected to the channel-matching portion 76 and in fluid communication with the channeling portion 64. The second bent portion 106 is also connected to the intermediate portion 104 so that the channeling portion 64 is in fluid communication with the intermediate portion 104. In this example, the second bent portion 106 has the same width (W2) as the channel-matching portion 76. The second bent portion 106 is configured to form an angled portion between the intermediate portion 104 and the channel-matching portion 76 so that cold air flows along the angled portion from the channeling portion 64 to the intermediate portion 104. Subsequently, the cold air flows along the first bent portion 102 toward the intake vent 50. In some embodiments, an angle (A2) of the second bent portion 106 is about 45 degree with respect to a surface parallel to the direction (d1) or the passage 68 of the channeling portion 64. In other embodiments, the angle (A2) of the second bent portion 106 can range between 20 and 80 degree, depending on several factors, including, but not limited to, a relative geometry of associated portions such as the dimensions of the first bent portion 102, the intermediate portion 104 and the second bent portion 106. In other embodiments, the second bent portion 106 is configured to have a curved portion having a predetermined curvature, which connects the channel-matching portion 76 and the intermediate portion 104.

Figure 9:
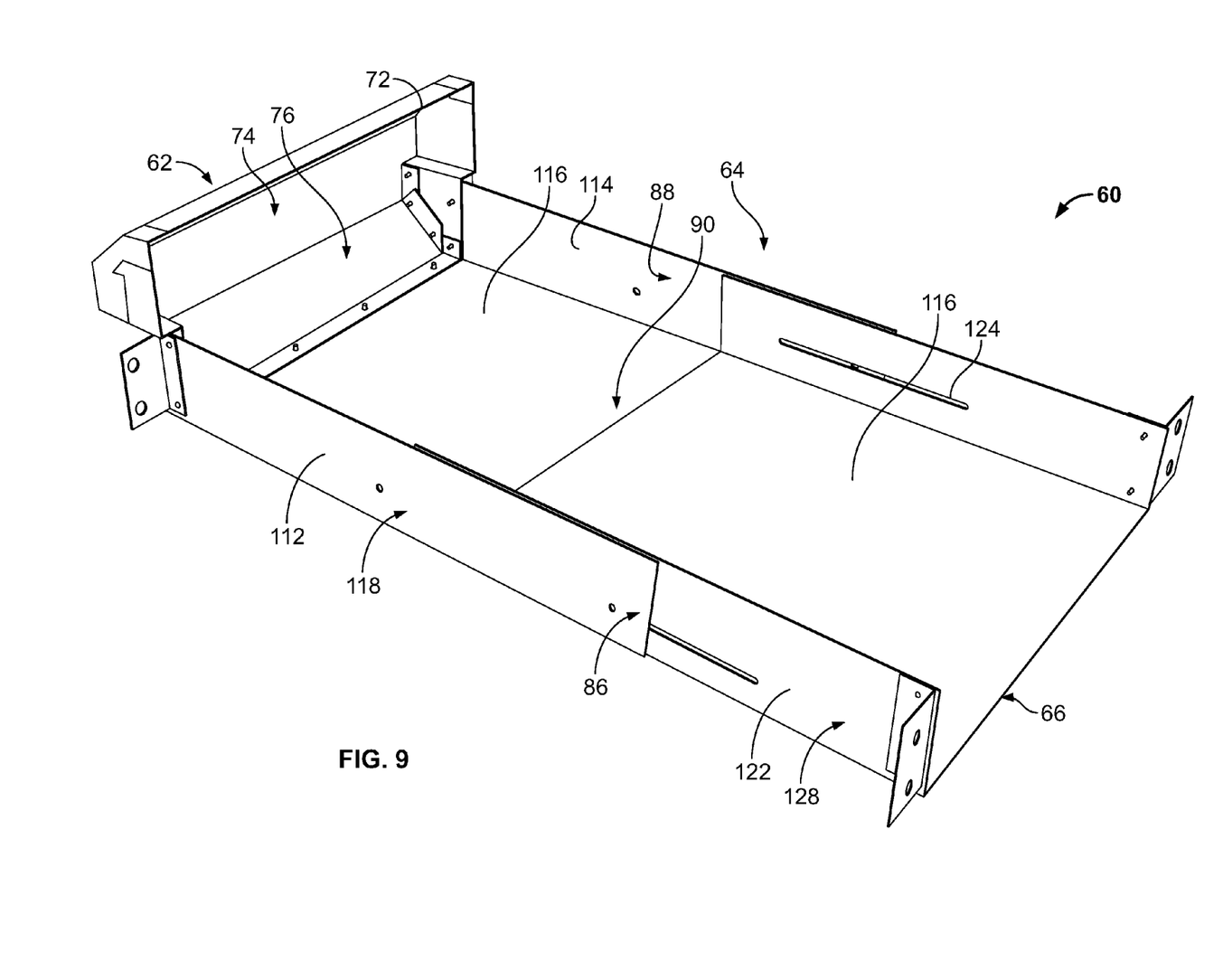
FIG. 9 is a schematic view of the routing apparatus of FIG. 6 with the channeling portion extended.

FIG. 9 is a schematic view of the routing apparatus 60 of FIG. 6 with the channeling portion 64 extended. In some embodiments, the channeling portion 64 is adjustable in length (Lc). The length (Lc) of the channeling portion 64 can be adjusted, depending on a length or depth of the bottom panel 42 between the front panel 36 and the rear panel 38 of the chassis 30. In other embodiments, the length (Lc) can be adjusted to arrange the distal portion 66 at a predetermined location with respect to the equipment rack 14 or the chassis 30. For example, if the distal portion 66 is to be arranged to protrude beyond the front panel 36 of the chassis at a predetermined distance, the channeling portion 64 can be extended to have a greater length (Lc) than the depth of the bottom panel 42 between the front panel 36 and the rear panel 38 of the chassis 30.

In some embodiments, the channeling portion 64 includes multiple sets of the opposing side panels 86 and 88 and the cross panel 90. In this example, the channeling portion 64 has two sets 118 and 128 of the panels. A first set 118 includes first opposing side panels 112 and 114 and a first cross panel 116. A second set 128 includes second opposing side panels 122 and 124 and a second cross panel 126. The first set 118 is engaged with the second set 128. In the example of FIG. 9, the second set 128 is accommodated within the first set 118. The second set 128 can slide on the first set 118 along the passage 68 of the channeling portion 64. In particular, the second opposing side panels 122 and 124 are slideably engaged with the first opposing side panels 112 and 114, respectively, and the second cross panel 126 is slideably engaged with the first cross panel 116. Therefore, the second opposing side panels 122 and 124 and the second cross panel 126 can selectively be pulled out from, or pushed into, the first opposing side panels 112 and 114 and the first cross panel 116 (or vice versa) to set the length (Lc) of the channeling portion 64.

The channeling portion 64 also includes a coupling device to connect the first set 118 and the second set 128. In some embodiments, the coupling device is a fastener, such as, but not limited to, bolts, clamps, clips, pins, latches, threaded fasteners, or other devices of any type. In other embodiments, the first set 118 and the second set 128 are coupled with slide rails, which can also provide slidable engagement between the first set 118 and the second set 128.

An additional embodiment is directed to a method of cooling the equipment racks 14 of FIGS. 2 and 3. In this embodiment, the rear panel 38 of the chassis 30 is arranged to face the cold aisle 18 so that both of the intake vent 50 and the exhaust vent 52 open toward the cold aisle 18. The method includes steps of supplying cold air from the CRAC units 16 to surrounding adjacent the rear panel 38 of the chassis 30; receiving, by the chassis 30, the cold air through the intake vent 50; after the cold air circulates within the equipment rack 14 and is heated by electronic equipment within the rack 14, discharging, by the chassis 30, the heated air through the exhaust vent 52; deflecting, by the routing apparatus 60 associated with the exhaust vent 52, the heated air to flow along the top panel 40 of the chassis 30 toward the front panel 36 of the chassis 30; and discharging, by the routing apparatus 60, the heated air to surrounding adjacent the front panel 36 of the chassis 30 at the hot aisle 20.

Yet another embodiment is directed to a method of cooling the equipment racks 14 of FIGS. 2 and 3. In this embodiment, the rear panel 38 of the chassis 30 is arranged to face the hot aisle 20 so that both of the intake vent 50 and the exhaust vent 52 open toward the hot aisle 20. The method includes steps of supplying cold air from the CRAC units 16 to surrounding adjacent the rear panel 38 of the chassis 30; receiving, by the routing apparatus 60 associated with the intake vent 50, cold air from surrounding adjacent the front panel 36 of the chassis 30 at the cold aisle 18; deflecting, by the routing apparatus 60, the cold air to flow along the bottom panel 42 of the chassis 30 toward the front panel 36 of the chassis 30; receiving, by the chassis 30, the cold air through the intake vent 50; and, after the cold air circulates within the equipment rack 14 and is heated by electronic equipment within the rack 14, discharging, by the chassis 30, the heated air through the exhaust vent 52 of the chassis 30 to surrounding adjacent the rear panel 38 of the chassis 30 at the hot aisle 20.

The various embodiments described above are provided by way of illustration only and should not be construed to limit the claims attached hereto. For example, although the routing apparatus is herein described to be used with equipment, it can also be applied to any type of racks, cabinets or enclosures for the purpose of changing a direction of air flowing into, or from, the racks, cabinets or enclosures. As such, those skilled in the art will readily recognize various modifications and changes that may be made without following the example embodiments and applications illustrated and described herein, and without departing from the true spirit and scope of the following claims.

What is claimed is:

1. An apparatus for routing air passing through a vent of an enclosure with electrical equipment, the air flowing in a first direction into the vent of the enclosure or flowing in a second direction from the vent of the enclosure, the first direction opposite to the second direction, the apparatus comprising:
    a routing portion engaged with the enclosure and being in fluid communication with the vent of the enclosure;
    a channeling portion being in fluid communication with the routing portion and forming a passage of the air; and
    a distal portion being in fluid communication with the channeling portion and open to surroundings, the distal portion configured to allow the air to flow from the channeling portion to the surroundings or from the surroundings to the channeling portion,
    wherein the routing portion is configured to:
        when the air flows through the channeling portion toward the routing portion in a third direction, deflect the air from the third direction to the first direction such that the air flows into the vent of the enclosure in the first direction, the third direction different from the first direction,
        when the air flows from the vent of the enclosure in the second direction, deflect the air from the second direction to a fourth direction such that the air flows through the channeling portion in the fourth direction and the distal portion allows the air to flow from the channeling portion to the surroundings, the fourth direction different from the second direction and opposite from the third direction,
    wherein the channeling portion has a first end and a second end, the first and second ends defining the passage therebetween,
    wherein the channeling portion includes a first set of opposing side panels and a cross panel extending between the opposing side panels, the opposing side panels and the cross panel expending between the first end and the second end,
    wherein the opposing side panels are engaged with a side of the enclosure, and the cross panel is arranged substantially in parallel with the side of the enclosure,
    wherein the passage is defined by the opposing side panels, the cross panel, the side of the enclosure, and
    wherein the channeling portion includes a second set of opposing side panels and a cross panel, the second set of the opposing side panels and the cross panel of the second set of opposing side panels slideably engaging with the first set of the opposing side panels and the cross panel, respectively, to adjust a length of the channeling portion along the passage.

2. The apparatus of claim 1, wherein the surroundings are adjacent a side of the enclosure different from a side of the enclosure having the vent.

3. The apparatus of claim 1,
    wherein the enclosure has a first side, a second side and a third side, the second side adjacent the first side, the third side opposite to the first side and adjacent the second side, wherein the vent is located at the first side of the enclosure;
    wherein the routing portion is engaged with the vent on the first side of the enclosure;
    wherein the channeling portion is engaged with the enclosure on the second side and forms the passage of the air in the second direction, the second direction being substantially parallel with the second side between the routing portion and the distal portion; and
    wherein the distal portion opens to the surroundings adjacent the third side of the enclosure.

4. The apparatus of claim 1, wherein the routing portion includes a coupling portion, a deflecting portion, and the channel-matching portion,
    wherein the coupling portion is configured to engage the vent of the enclosure and dimensioned to match a size of the vent,
    wherein the channel-matching portion is coupled to the channeling portion and in fluid communication with the channeling portion, and
    wherein the deflecting portion includes a first bent portion, an intermediate portion and a second bent portion, the first bent portion connected to the coupling portion, the second bent portion connected to the channel-matching portion, and the intermediate portion connecting the first bent portion to the second bent portion, wherein the first bent portion is configured to deflect the air flowing between the vent of the enclosure and the intermediate portion, and wherein the second bent portion is configured to deflect the air flowing between the intermediate portion and the channel-matching portion.

5. An air conditioning system for data center hardware, the system comprising:

an enclosure with electrical equipment, the enclosure having a first vent and a second vent at a first side thereof, wherein the first vent is configured to allow air at a first temperature to flow in a first direction into the enclosure, and the second vent is configured to allow the air at a second temperature to flow in a second direction from the enclosure, the second temperature being different from the first temperature and the second direction opposite to the first direction, and a routing device configured to route the air at the first temperature between the first vent and the surroundings, the routing device comprising:

a routing portion engaged with the enclosure and being in fluid communication with the first vent of the enclosure;

a channeling portion being in fluid communication with the routing portion and forming a passage for the air at the first temperature; and a distal portion being in fluid communication with the channeling portion and open to the surroundings, the distal portion configured to allow the air at the first temperature to flow between the channeling portion and the surroundings, the surroundings adjacent a second side of the enclosure, the second side being different from the first side of enclosure, wherein the routing portion is configured to deflect the air flowing in a third direction through the channeling portion to the first direction such that the air flows through the first vent in the first direction, the third direction different from the first direction, wherein the channeling portion has a first end and a second end, the first and second ends defining the passage therebetween, wherein the channeling portion includes a first set of opposing side panels and a cross panel extending between the opposing side panels, the opposing side panels and the cross panel expending between the first end and the second end, wherein the opposing side panels are engaged with a side of the enclosure, and the cross panel is arranged substantially in parallel with the side of the enclosure, wherein the passage is defined by the opposing side panels, the cross panel, the side of the enclosure, wherein the channeling portion includes a second set of opposing side panels and a cross panel, the second set of the opposing side panels and the cross panel slideably engaging with the first set of the opposing side panels and the cross panel, respectively, to adjust a length of the channeling portion along the passage.

6. The system of claim 5, further comprising:

an air source providing the air at the first temperature, the first temperature lower than the second temperature, wherein the enclosure further has a third side adjacent the first side and the second side, the second side opposite to the first side, wherein the first vent and the second vent are located at the first side of the enclosure;

wherein the routing portion is engaged with the first vent on the first side of the enclosure;

wherein the channeling portion is engaged with the enclosure on the third side and forms the passage of the air in the third direction, the third direction being substantially parallel with the third side between the routing portion and the distal portion; and wherein the distal portion is arranged adjacent the second side of the enclosure and opens to the surroundings adjacent the second side.

7. The system of claim 6, wherein the air at the first temperature is supplied to the second side of the enclosure, and wherein the distal portion is configured to receive the air at the first temperature therethrough and deliver the air at the first temperature to the routing portion through the channeling portion.

8. The system of claim 5, wherein the routing portion includes a coupling portion, a deflecting portion, and the channel-matching portion, wherein the coupling portion is configured to engage the first vent of the enclosure and dimensioned to match a size of the first vent, wherein the channel-matching portion is coupled to the channeling portion and in fluid communication with the channeling portion, and wherein the deflecting portion includes a first bent portion, an intermediate portion and a second bent portion, the first bent portion connected to the coupling portion, the second bent portion connected to the channel-matching portion, and the intermediate portion connecting the first bent portion to the second bent portion, wherein the first bent portion is configured to deflect the air flowing between the first vent of the enclosure and the intermediate portion, and wherein the second bent portion is configured to deflect the air flowing between the intermediate portion and the channel-matching portion.

9. The system of claim 5, further comprising:

an air source providing the air at the first temperature to the first vent of the enclosure, the first temperature lower than the second temperature, and a second routing device configured to route the air at the second temperature between the second vent and the surroundings, the second routing device comprising:

a second routing portion engaged with the enclosure and being in fluid communication with the second vent of the enclosure;

a second channeling portion being in fluid communication with the second routing portion and forming a second passage for the air at the second temperature; and a second distal portion being in fluid communication with the second channeling portion and open to the surroundings, the second distal portion configured to allow the air at the second temperature to flow between the second channeling portion and the surroundings, the surroundings adjacent the second side of the enclosure, wherein the second routing portion is configured to deflect the air flowing from the second vent in the second direction to a fourth direction such that the air flows through the second channeling portion in the fourth direction and the second distal portion allows the air to flow from the second channeling portion to the surroundings, the fourth direction different from the second direction and opposite from the third direction.

10. The system of claim 9, wherein the enclosure further has a third side adjacent the first side and the second side, the second side opposite to the first side, wherein the first vent and the second vent are located at the first side of the enclosure;

wherein the second routing portion is engaged with the second vent on the first side of the enclosure, the second vent configured to discharge the air at the second temperature from the enclosure;

wherein the second channeling portion is engaged with the enclosure on the third side and forms the second passage of the air at the second temperature in the fourth direction, the fourth direction being substantially parallel with the third side toward the second side of the enclosure; and wherein the second distal portion is arranged adjacent the second side of the enclosure and opens to the surroundings adjacent the second side.

11. The system of claim 10, wherein the air at the first temperature is supplied to the first side of the enclosure, and wherein the distal portion is configured to discharge the air at the second temperature to the surroundings.

12. An air conditioning system for data center hardware, the system comprising:

an enclosure with electrical equipment, the enclosure having a first vent and a second vent at a first side thereof, wherein the first vent is configured to allow air at a first temperature to flow in a first direction into the enclosure, and the second vent is configured to allow the air at a second temperature to flow in a second direction from the enclosure, the second temperature being different from the first temperature and the second direction opposite to the first direction, and a routing device configured to route the air at the second temperature between the second vent and the surroundings, the routing device comprising:

a routing portion engaged with the enclosure and being in fluid communication with the second vent of the enclosure;

a channeling portion being in fluid communication with the routing portion and forming a passage for the air at the second temperature; and a distal portion being in fluid communication with the channeling portion and open to the surroundings, the distal portion configured to allow the air at the second temperature to flow between the channeling portion and the surroundings, the surroundings adjacent a second side of the enclosure, the second side being different from the first side of enclosure, wherein the routing portion is configured to deflect the air flowing from the second vent in the second direction to a third direction such that the air flows through the channeling portion in the third direction and the distal portion allows the air to flow from the channeling portion to the surroundings, the third direction different from the second direction, wherein the channeling portion has a first end and a second end, the first and second ends defining the passage therebetween, wherein the channeling portion includes a first set of opposing side panels and a cross panel extending between the opposing side panels, the opposing side panels and the cross panel expending between the first end and the second end, wherein the opposing side panels are engaged with a side of the enclosure, and the cross panel is arranged substantially in parallel with the side of the enclosure, wherein the passage is defined by the opposing side panels, the cross panel, the side of the enclosure, wherein the channeling portion includes a second set of opposing side panels and a cross panel, the second set of the opposing side panels and the cross panel slideably engaging with the first set of the opposing side panels and the cross panel, respectively, to adjust a length of the channeling portion along the passage.

* * * * *